United States Patent
Augustin et al.

(10) Patent No.: US 11,456,116 B2
(45) Date of Patent: Sep. 27, 2022

(54) MAGNETIC COILS IN LOCALLY THINNED SILICON BRIDGES AND METHODS OF ASSEMBLING SAME

(71) Applicant: Intel Corporation, Santa Clara, CA (US)

(72) Inventors: Andreas Augustin, Munich (DE); Bernd Waidhas, Pettendorf (DE); Sonja Koller, Regensburg (DE); Reinhard Mahnkopf, Oberhaching (DE); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 359 days.

(21) Appl. No.: 16/474,015

(22) PCT Filed: Mar. 30, 2017

(86) PCT No.: PCT/US2017/025083
§ 371 (c)(1),
(2) Date: Jun. 26, 2019

(87) PCT Pub. No.: WO2018/182630
PCT Pub. Date: Oct. 4, 2018

(65) Prior Publication Data
US 2020/0111607 A1    Apr. 9, 2020

(51) Int. Cl.
*H01F 27/24* (2006.01)
*H01F 41/04* (2006.01)
(Continued)

(52) U.S. Cl.
CPC ....... *H01F 41/046* (2013.01); *H01F 17/0006* (2013.01); *H01F 27/24* (2013.01);
(Continued)

(58) Field of Classification Search
CPC .... H01F 41/046; H01F 17/0006; H01F 27/24; H01F 2017/0066; H01F 2017/0086;
(Continued)

(56) References Cited

U.S. PATENT DOCUMENTS

| 7,319,377 B2 * | 1/2008 | Lee ................... H01L 21/6835 257/E21.599 |
| 2013/0093032 A1 | 4/2013 | Webb |

(Continued)

OTHER PUBLICATIONS

"International Application Serial No. PCT/US2017/025083, International Search Report dated Dec. 28, 2017", 3 pgs.

(Continued)

*Primary Examiner* — Tuyen T Nguyen
(74) *Attorney, Agent, or Firm* — Schwegman Lundberg & Woessner, P.A.

(57) ABSTRACT

A recess in a die backside surface occupies a footprint that accommodates an inductor coil that is formed in metallization above an active surface of the die. Less semiconductive material is therefore close to the inductor coil. A ferromagnetic material is formed in the recess, or a ferromagnetic material is formed on a dielectric layer above the inductor coil. The recess may extend across a die that allows the die to be deflected at the recess.

18 Claims, 7 Drawing Sheets

(51) Int. Cl.
*H01F 17/00* (2006.01)
*H01L 23/64* (2006.01)
*H01L 27/01* (2006.01)
*H01L 49/02* (2006.01)

(52) U.S. Cl.
CPC .......... *H01L 23/645* (2013.01); *H01L 27/016* (2013.01); *H01L 28/10* (2013.01); *H01F 2017/0066* (2013.01); *Y10T 428/32* (2015.01)

(58) Field of Classification Search
CPC ..... H01L 23/645; H01L 27/016; H01L 28/10; Y10T 428/32
See application file for complete search history.

(56) References Cited

U.S. PATENT DOCUMENTS

2016/0268195 A1    9/2016   Lee et al.
2017/0084545 A1    3/2017   Seddon et al.

OTHER PUBLICATIONS

"International Application Serial No. PCT/US2017/025083, Written Opinion dated Dec. 28, 2017", 8 pgs.
"International Application Serial No. PCT US2017 025083, International Preliminary Report on Patentability dated Oct. 10, 2019", 10 pgs.

\* cited by examiner

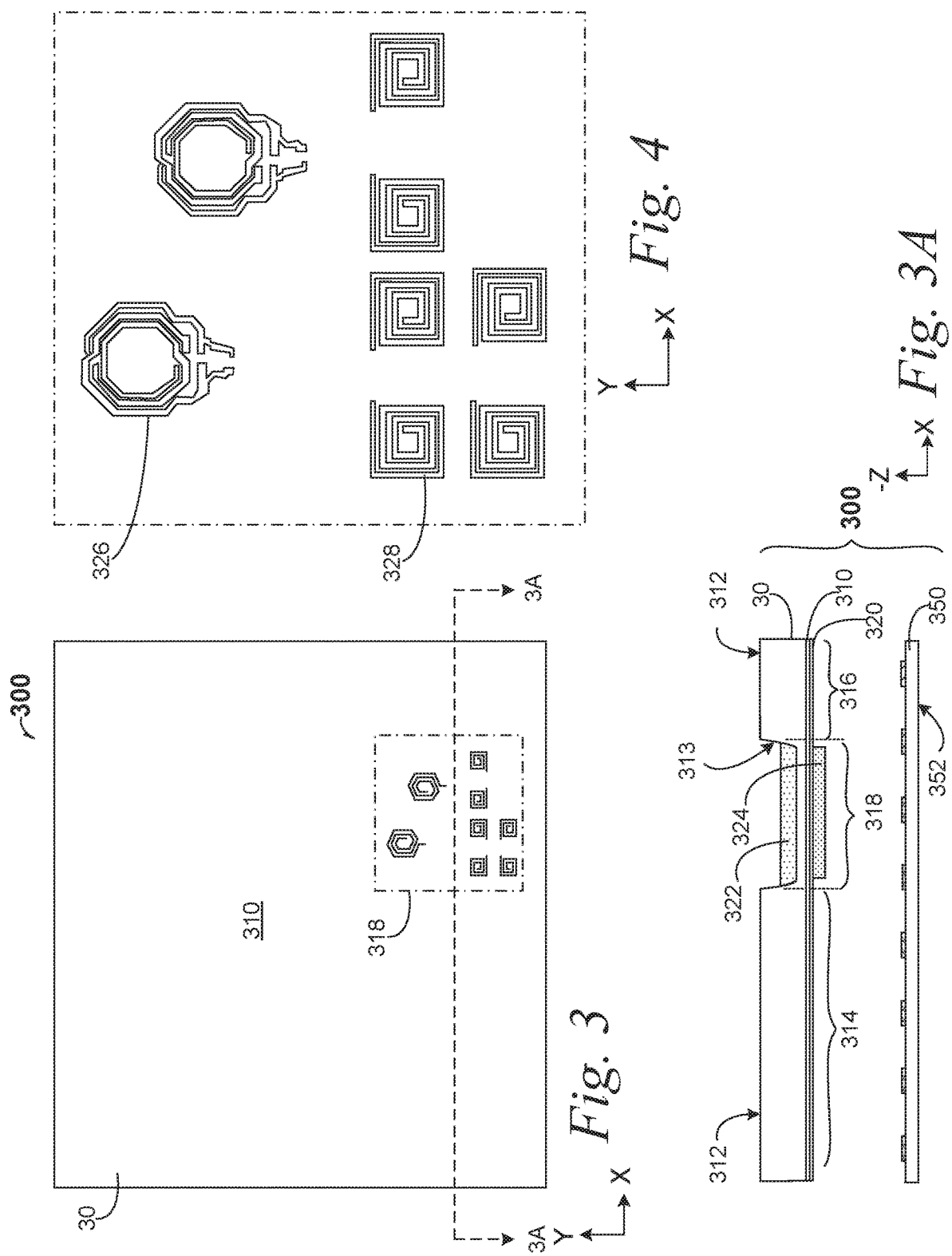

MAGNETIC COILS IN LOCALLY THINNED SILICON BRIDGES AND METHODS OF ASSEMBLING SAME

CLAIM OF PRIORITY

This application is a U.S. National Stage Application under 35 U.S.C. 371 from International Application No. PCT/US2017/025083, filed Mar. 30, 2017, published as WO 2018/182630, which is incorporated herein by reference in its entirety.

FIELD

This disclosure relates to magnetic coils in thinned silicon-bridge regions of semiconductive apparatus.

BACKGROUND

Semiconductive device miniaturization creates challenges for locating useful passive devices during integration. Additionally, interconnection between areas in a semiconductive device requires intensive processing.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 3 is a top plan of a semiconductive die including a thinned-bridge region according to an embodiment;

FIG. 3A is a cross-section elevation of the semiconductive die depicted in FIG. 3, taken along the section line 3A-3A according to an embodiment;

FIG. 4 is a detail section taken from the passive-device sector depicted in FIGS. 3 and 3A;

DETAILED DESCRIPTION

Coiled inductor structures useful with integrated systems, are needed in mobile communication devices and other systems. Coils perform better when located close to the active devices in the system, but also when they are separated from the semiconductive material. Magnetic performance is further improved by deploying ferromagnetic material near the coiled inductor structure.

Figure 1A:
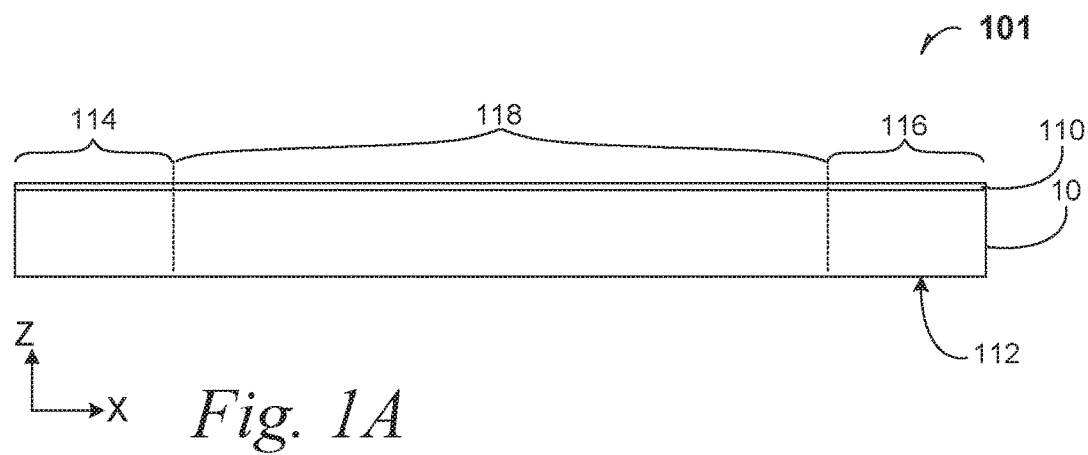
FIG. 1A is a cross-section elevation of a semiconductive device apparatus that includes a thinned silicon-bridge region for a coil during processing according to an embodiment.

FIG. 1A is a cross-section elevation of a semiconductive device apparatus 101 that includes a thinned silicon-bridge region for a coil during processing according to art embodiment. It may be understood the term "silicon" is meant to cover semiconductive material including silicon, and doped silicon. In an embodiment, the term "silicon" is meant to cover non-silicon semiconductive material including semiconductive solid solutions. In an embodiment, the term "silicon" is meant to cover graphene-monolayer semiconductive material.

A semiconductive die 10 includes an active surface 110 and a backside surface 112. During processing, the semiconductive die 10 is demarcated with a first semiconductive device sector 114 and a subsequent semiconductive device sector 116. In an embodiment, these sectors 114 and 116 are primarily useful as contact areas for the whole (not necessarily pictured) of the semiconductive die 10. A passive-device sector 118 is located between the respective first and subsequent semiconductive device sectors 114 and 116.

Figure 1B:
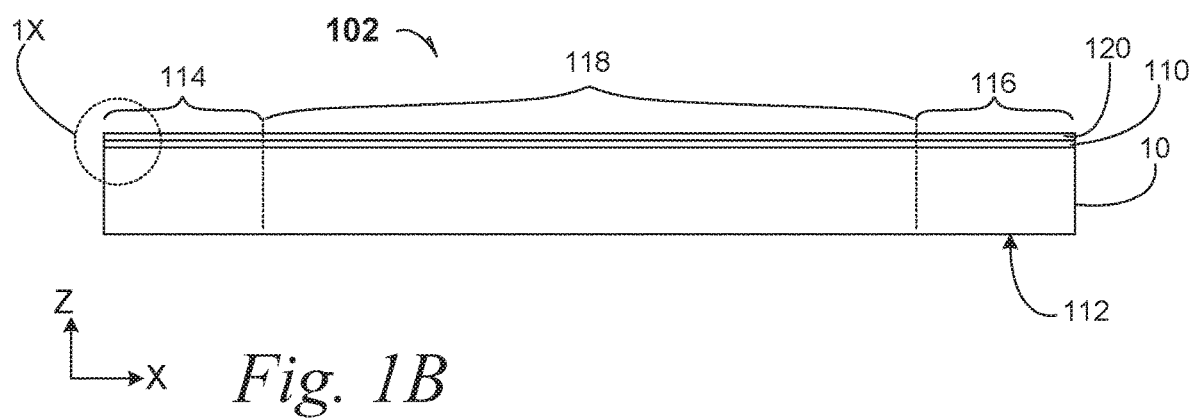
FIG. 1B is a cross-section elevation of the semiconductive device apparatus depicted in FIG. 1A after further processing according to an embodiment.

FIG. 1B is a cross-section elevation 102 of the semiconductive device apparatus 101 depicted in FIG. 1A after further processing according to an embodiment. A metallization layer 120 has been fabricated in contact with the active surface 110 of the semiconductive die 10 according to an embodiment. The metallization layer 120 includes metallization for the respective first and subsequent semiconductive device sectors 114 and 116. Additionally, the metallization layer 120 has been processed to form a passive device in the passive-device sector 118. In an embodiment, a spiral inductor coil is formed in the metallization layer 120 within the passive-device sector 118.

Figure 1X:
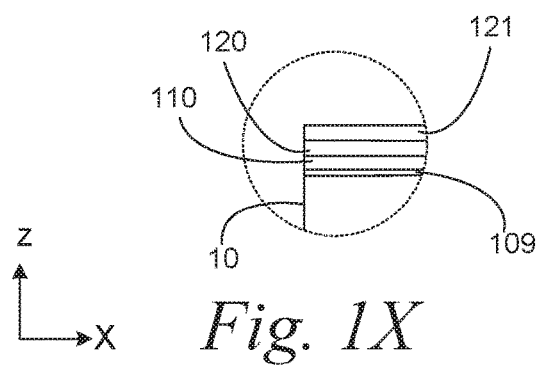
FIG. 1X is an extract detail section taken from FIG. 1B according to an embodiment.

FIG. 1X is an extract detail section taken from FIG. 1B according to an embodiment. The semiconductive die 10 is shown in greater detail where a silicon carbide film 109 is used at the active surface 110 and the bulk semiconductive material of the semiconductive die 10. The active surface 110 is topped by the metallization layer 120, and the metallization layer 120 is covered by a dielectric film 121 according to an embodiment. During backside etching (see FIG. 1C) the silicon carbide film 109 is used as a precautionary etchstop layer 109 to prevent wet etching from encroaching into the active surface 110. During processing to apply a ferromagnetic film (see item 124 in FIG. 1D), the dielectric film 121 is used to protect the metallization layer 120.

Figure 1C:
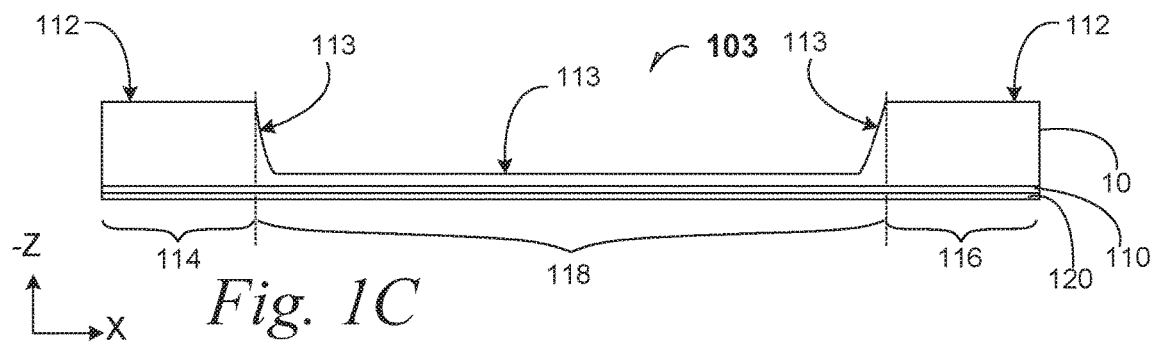
FIG. 1C is a cross-section elevation of the semiconductive device apparatus depicted in FIG. 1B after further processing according to an embodiment.

FIG. 1C is a cross-section elevation 103 of the semiconductive device apparatus 102 depicted in FIG. 1B after further processing according to an embodiment. The apparatus 103 has been inverted as reflected in the negative-Z coordinates. Etch processing is carried out to thin the passive-device sector 118 from the backside 112 to open a recess 113. The recess 113 preserves some of the original semiconductive material and the region of the active surface 110 and the metallization layer 120 within the passive device sector 118. The recess 113 can be seen to extend into and out of the plane of the figure such that to allow deflection of the semiconductive die 10 as depicted in FIG. 1E. In an embodiment, the recess 113 extends across the entire breadth (in the Y-direction) of the die 10.

In an embodiment, the depth of the recess 113 is quantified as a function of the overall Z-direction height of the semiconductive die 10. As illustrated and can be visually estimated, where the overall Z-direction height is unity, the recess 113 reaches bottom at a Z-direction depth that is more than half unity. In an embodiment, the recess 113 reaches bottom at a Z-direction depth that is about 80 percent of unity. In an embodiment, the recess 113 reaches bottom at a Z-direction depth that is about 50 percent of unity. In an embodiment, the recess 113 reaches bottom at a Z-direction depth that is about 20 percent of unity. In useful embodiments, flexure of the passive device sector 118 uses a thinner section. In other useful embodiments, location of ferromagnetic material uses a recess 113 depth that accommodates the ferromagnetivity of the material.

Figure 1D:
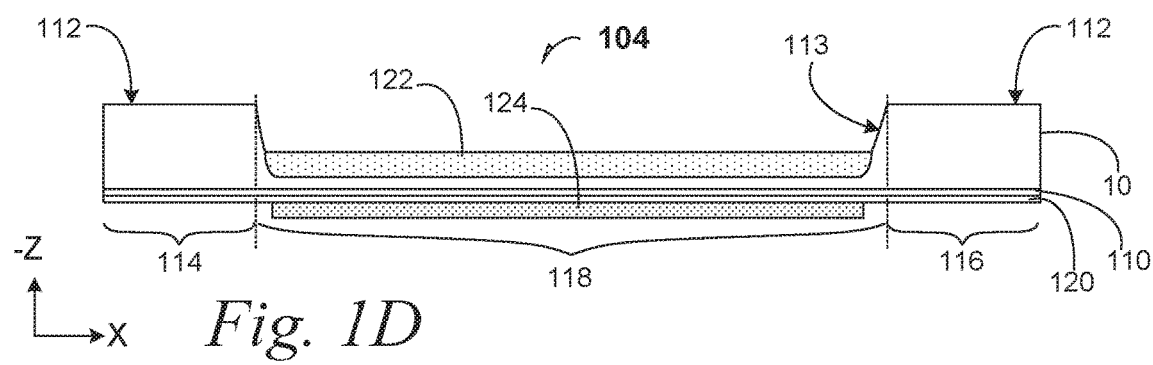
FIG. 1D is a cross-section elevation of the semiconductive device apparatus depicted in FIG. 1C after further processing according to an embodiment.
Figure 1E:
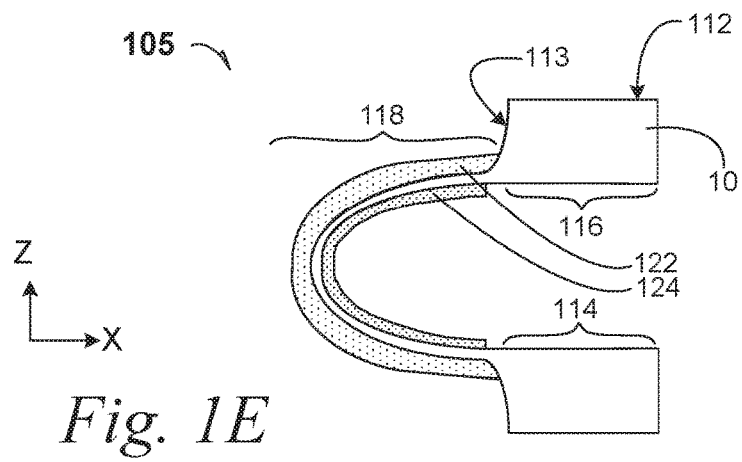
FIG. 1E is a cross-section elevation of the semiconductive device apparatus depicted in FIG. 1D after further processing according to an embodiment.

FIG. 1D is a cross-section elevation 104 of the semiconductive device apparatus 103 depicted in FIG. 1C after further processing according to an embodiment. The apparatus 104 has been processed to receive a backside ferromagnetic layer 122 within the recess 113. The backside ferromagnetic layer 122 is filled into the recess 113 but as illustrated according to an embodiment, it does not fill the recess 113 up to the backside surface 112. In an embodiment, the backside ferromagnetic layer 122 fills the recess 113 to a level equal to the backside surface 112 of the semiconductive die 10.

In an embodiment, the particular ferromagnetivity of the backside ferromagnetic layer 122 is selected to be useful for an inductor coil located within the passive device sector 118 of the metallization layer 120. Ferromagnetivity may be measured and characterized by magnetic field, H, ampere/meter; flux density, B, Tesla; flux, f, Weber; and magnetization, M, ampere/meter.

In an embodiment, an active surface ferromagnetic layer 124 is applied to the apparatus 104 on the metallization layer 120 and close to the active surface 110. In an embodiment, only the active surface ferromagnetic layer 124 is applied to the semiconductive die 10. In an embodiment, only the backside ferromagnetic layer 122 is applied to the semiconductive die 10. In an embodiment, the ferromagnetivity of the backside ferromagnetic layer 122 is the same as the ferromagnetivity of the active surface ferromagnetic layer 124. In an embodiment, the ferromagnetivity of the backside ferromagnetic layer 122 is quantitively different than the ferromagnetivity of the active surface ferromagnetic layer 124. In an embodiment, the ferromagnetivity of the backside ferromagnetic layer 122 is greater than the ferromagnetivity of the active surface ferromagnetic layer 124. In an embodiment, the ferromagnetivity of the backside ferromagnetic layer 122 is less than the ferromagnetivity of the active surface ferromagnetic layer 124.

FIG. 1E is a cross-section elevation 105 of the semiconductive device apparatus 104 depicted in FIG. 1D after further processing according to an embodiment. The apparatus 105 is deflected out of planarity at the passive device sector 118. In an embodiment as illustrated, the apparatus 105 deflected a full 180° out of planarity at the passive device sector 118 and the recess 113 has been deflected until it has a convex overall profile. In other words, the apparatus 104 is folded in half without fracturing structures of semiconductive material the passive device sector 118. In an embodiment, the apparatus 105 may be deflected more than 180°, subject to limitations of, e.g. portions of the respective first and subsequent semiconductive device sectors 116 and 118 may touch.

In an embodiment, the apparatus 105 is bent oppositely than illustrated such that contact of the die backside surfaces 112 touch, the degree of deflection may be more than 180°, subject to the length of the thinned region 118 and the thickness of the sectors 116 and 118. In other words, the and the recess 113 has been deflected and it has retained a concave overall profile.

In an embodiment, the apparatus 105 is deflected within an acute angle such as 90° or less in a configuration such as to contour onto a curved mother board. In an embodiment, the apparatus 105 is deflected within an acute angle such as 90° or less in a configuration such as to contour onto a curved mother board.

In an embodiment, processing of at least one ferromagnetic layer is carried out after bending the passive device sector 118 to cause the at least one ferromagnetic layer to cure and harden. In an embodiment, a low-temperature heat soak is carried out between 40° C. and 70° C. over about 5 hours to drive fugitive plasticizing agents from the at least one ferromagnetic layer without causing a thermal budget issue for the active devices within the semiconductive die 10. In an embodiment, the at least one ferromagnetic layer has a light-energy curing agent and the at least one ferromagnetic layer is light-energy cured and hardened.

It may now be appreciated that the semiconductive die 10 may be processed with a single ferromagnetic layer, two ferromagnetic layers, it may be bent at the passive device sector 118, or it may remain substantially planar. These permutations may each be carried out as separate embodiments with distinct useful end-result performance qualities for a selected thinned-bridge apparatus.

Figure 2A:
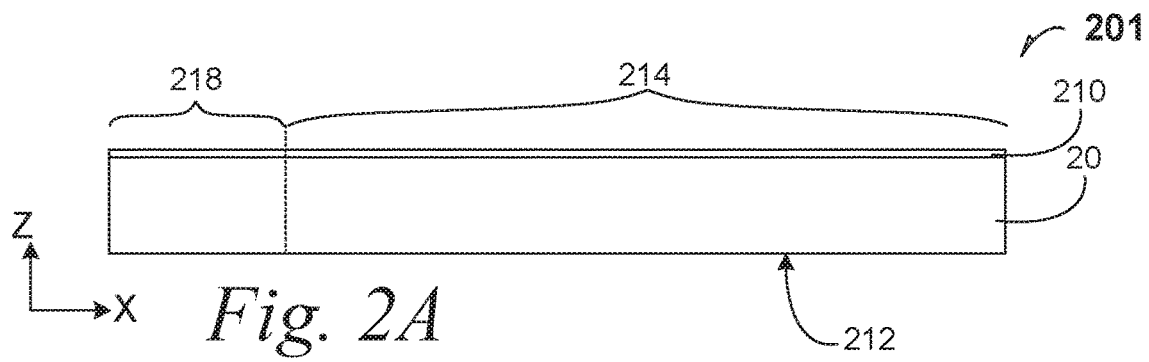
FIG. 2A is a cross-section elevation of a semiconductive device apparatus that includes a thinned silicon-bridge region for a coil during processing according to an embodiment.

FIG. 2A is a cross-section elevation of a semiconductive device apparatus 201 that includes a thinned silicon-bridge region for a coil during processing according to an embodiment.

A semiconductive die 20 includes an active surface 210 and a backside surface 212. During processing, the semiconductive die 20 is demarcated with a first semiconductive device sector 214. In an embodiment, the first semiconductive device sector 214 is useful both as a contact area and for logic processing areas of the whole semiconductive die 20. A passive-device sector 218 is edge-located adjacent the first semiconductive device sector 214.

Figure 2B:
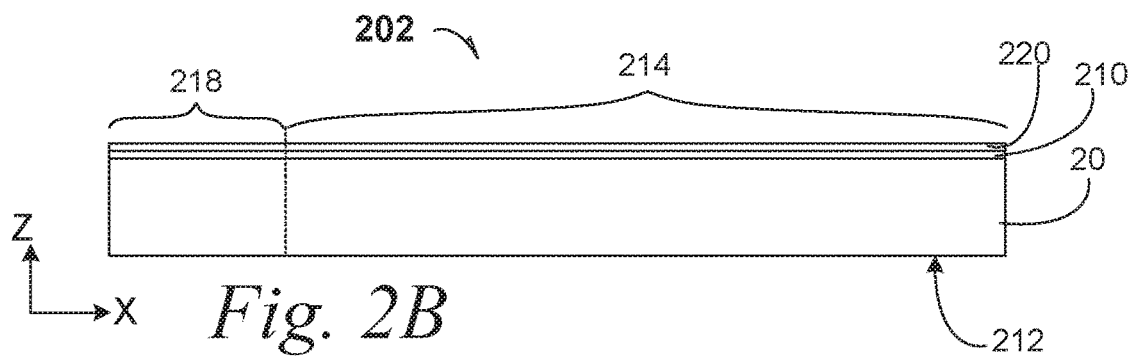
FIG. 2B is a cross-section elevation of the semiconductive device apparatus depicted in FIG. 2A after further processing according to an embodiment.

FIG. 2B is a cross-section elevation 202 of the semiconductive device apparatus 201 depicted in FIG. 2A after further processing according to an embodiment. A metallization layer 220 has been fabricated in contact with the active surface 210 of the semiconductive die 20 according to an embodiment. The metallization layer 220 includes metallization for the first semiconductive device sector 214. Additionally, the metallization layer 220 has been processed to form a passive device in the passive-device sector 218. In an embodiment, a spiral inductor coil is formed in the metallization layer 220 within the passive-device sector 218.

Figure 2C:
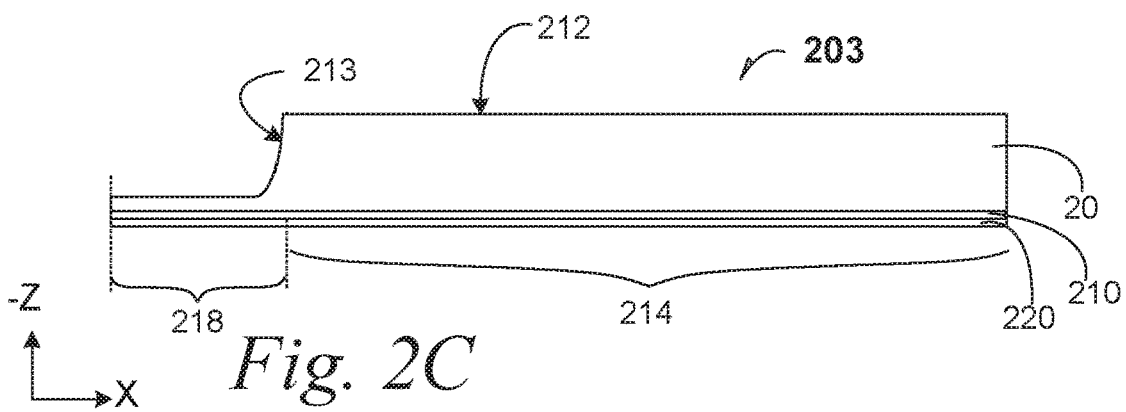
FIG. 2C is a cross-section elevation of the semiconductive device apparatus depicted in FIG. 2B after further processing according to an embodiment.

FIG. 2C is a cross-section elevation 203 of the semiconductive device apparatus 202 depicted in FIG. 2B after further processing according to an embodiment. The apparatus 203 has been inverted as reflected in the negative-Z coordinates. Etch processing is carried out to thin the passive-device sector 218 from the edge at the backside 212 to open an edge recess 213. The edge recess 213 preserves some of the original semiconductive material and the region of the active surface 210 and the metallization layer 220 within the passive device sector 218. Processing to achieve the edge recess 213 within the passive-device sector 218 may be referred to a local, exclave thinning. In an embodiment, the passive-device sector 218 traverses an entire edge of the semiconductive die 20. In an embodiment, the passive-device sector 218 has a footprint less than an entire edge of the semiconductive die 20, but it is set at the die edge and includes the entire breadth of the die 20.

Figure 2D:
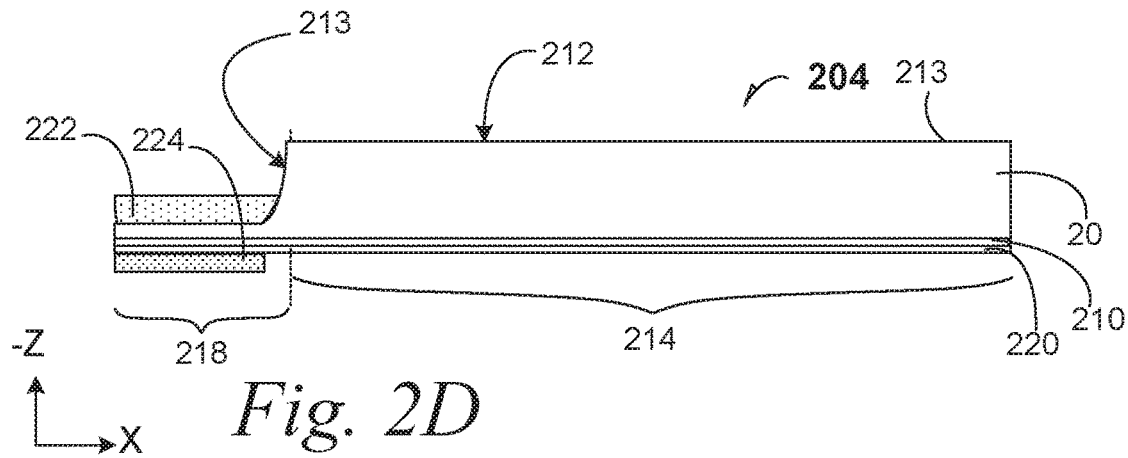
FIG. 2D is a cross-section elevation of the semiconductive device apparatus depicted in FIG. 2C after further processing according to an embodiment.

FIG. 2D is a cross-section elevation 204 of the semiconductive device apparatus 203 depicted in FIG. 2C after further processing according to an embodiment. The apparatus 204 has been processed to receive a backside ferromagnetic layer 222 within the edge recess 213.

The backside ferromagnetic layer 222 is filled into the edge recess 213 but as illustrated according to an embodiment, it does not fill the edge recess 213 to the backside surface 212. In an embodiment, the particular ferromagnetivity of the backside ferromagnetic layer 222 is selected to be useful for an inductor coil located within the passive device sector 218 of the metallization layer 220. In an embodiment, the backside ferromagnetic layer 222 fills the edge recess 213 to a level equal to the backside surface 212 of the semiconductive die 20.

In an embodiment, an active surface ferromagnetic layer 224 is applied to the apparatus 204 on the metallization layer 220 and close to the active surface 210. In an embodiment, only the active surface ferromagnetic layer 224 is applied to the semiconductive die 20. In an embodiment, only the backside ferromagnetic layer 222 is applied to the semiconductive die 20. In an embodiment, the ferromagnetivity of the backside ferromagnetic layer 222 is the same as the ferromagnetivity of the active surface ferromagnetic layer 224. In an embodiment, the ferromagnetivity of the backside ferromagnetic layer 222 is quantitively different than the ferromagnetivity of the active surface ferromagnetic layer 224. In an embodiment, the ferromagnetivity of the backside ferromagnetic layer 222 is more than the ferromagnetivity of the active surface ferromagnetic layer 224. In an embodiment, the ferromagnetivity of the backside ferromagnetic layer 222 is less than the ferromagnetivity of the active surface ferromagneticactive surface ferromagnetic layer 224.

In an embodiment, processing of at least one ferromagnetic layer is carried out after bending the passive device sector 218 to cause the at least one ferromagnetic layer to cure and harden. In an embodiment, a low-temperature heat soak is carried out between 40° C. and 70° C. over about 5 hours to drive fugitive plasticizing agents from the at least one ferromagnetic layer without causing a thermal budget issue for the active devices within the semiconductive die 10. In an embodiment, the at least one ferromagnetic layer has a light-energy curing agent and the at least one ferromagnetic layer is light-energy cured and hardened.

FIG. 3 is a top plan 300 of a semiconductive die 30 including a thinned-bridge region according to an embodiment. The semiconductive die 30 includes an active surface 310 and a backside surface 312 (see FIG. 3A). During processing, the semiconductive (lie 30 is demarcated with passive-device sector 318, depicted in dashed lines. The passive-device sector 318 is depicted with two occurrences of circular, nested inductor coils 326 (see FIG. 4), and six occurrences of simple rectangular spiral coils 328.

In an embodiment beside the passive-device sector 318, the balance of the active surface 310 is used for active semiconductive devices.

FIG. 3A is a cross-section elevation 300 of the semiconductive die 30 depicted in FIG. 3, taken along the section line 3A-3A according to an embodiment. The apparatus 300 has been inverted as reflected in the negative-Z coordinates. Etch processing is carried out to thin the passive-device sector 318 from the die backside 312 to open a recess 313. The recess 313 preserves some of the original semiconductive material and the region of the active surface 310 and the metallization layer 320 within the passive device sector 318. Processing to achieve the recess 313 within the passive-device sector 318 may be referred to a local, enclave thinning. In contrast to the edge recess 213 depicted in FIG. 2D, the passive-device sector 318 is not at the die edge.

As also can be seen in this cross-section elevation 300, during processing, the semiconductive die 30 is demarcated with a first semiconductive, device sector 314 and a subsequent semiconductive device sector 316. In an embodiment, these sectors 314 and 316 are primarily useful as contact areas, near the boundaries of the passive device sector 118, for the whole (see FIG. 3) of the semiconductive die 30.

FIG. 3A also depicts further processing according to an embodiment. The apparatus 300 has been processed to receive a backside ferromagnetic layer 322 within the recess 313. The backside ferromagnetic layer 322 is filled into the recess 313 but as illustrated according to an embodiment, it does not fill the recess 313 to the backside surface 312. In an embodiment, the particular ferromagnetivity of the backside ferromagnetic layer 322 is selected to be useful for an inductor coil located within the passive device sector 318 of the metallization layer 320. In an embodiment, the backside ferromagnetic layer 322 fills the recess 313 to a level equal to the backside surface 312 of the semiconductive die 30.

In an embodiment, an active surface ferromagneticactive surface ferromagnetic layer 324 is applied to the apparatus 300 on the metallization layer 320 and close to the active surface 310. In an embodiment, only the active surface ferromagneticactive surface ferromagnetic layer 324 is applied to the semiconductive die 30. In an embodiment, only the backside ferromagnetic layer 322 is applied to the semiconductive die 30. In an embodiment, the ferromagnetivity of the backside ferromagnetic layer 322 is the same as the ferromagnetivity of the active surface ferromagneticactive surface ferromagnetic layer 324. In an embodiment, the ferromagnetivity of the backside ferromagnetic layer 322 is quantitively different than the ferromagnetivity of the active surface ferromagnetic layer 324. In an embodiment, the ferromagnetivity of the backside ferromagnetic layer 322 is greater than the ferromagnetivity of the active surface ferromagnetic layer 324. In an embodiment, the ferromagnetivity of the backside ferromagnetic layer 322 is less than the ferromagnetivity of the active surface ferromagnetic layer 324.

In an embodiment, processing of at least one ferromagnetic layer is carried out to cause the at least one ferromagnetic layer to cure and harden. In an embodiment, a low-temperature heat soak is carried out between 40° C. and 70° C. over 5 hours to drive fugitive plasticizing agents from the at least one ferromagnetic layer without causing a thermal budget issue for the active devices within the semiconductive die 30. In an embodiment, the at least one ferromagnetic layer has a light-energy curing agent and the at least one ferromagnetic layer is light-energy cured and hardened.

It may now be appreciated that the semiconductive die 30 may be processed with a single ferromagnetic layer or two ferromagnetic layers and the ferromagnetivity may be varied between the two layers. These permutations may each be carried out as separate embodiments with distinct useful end-result performance qualities for a selected thinned-bridge apparatus.

FIG. 4 is a detail section 318 taken from the passive-device sector 318 depicted in FIGS. 3 and 3A. The passive-device sector 318 is depicted with two occurrences of circular, nested inductor coils 326 and four occurrences of simple rectangular spiral coils 328. Other details of circuitry are not depicted.

It may now be observed that the passive-device sector 118 depicted in FIGS. 1D and 1E allows the semiconductive die 10 to be configured as a "thinned bridge" and a "flexible bridge" or "bent-bridge" semiconductive apparatus. It may now also be observed that the passive-device sector 218 depicted in FIG. 2D allows the semiconductive die 20 to be configured as a "thinned edge" semiconductive apparatus. It may now also be observed that the passive-device sector 318 depicted in FIG. 3A allows the semiconductive die 30 to be configured as a "thinned-membrane enclave" or a "drumhead bridge" semiconductive apparatus.

Figure 5:
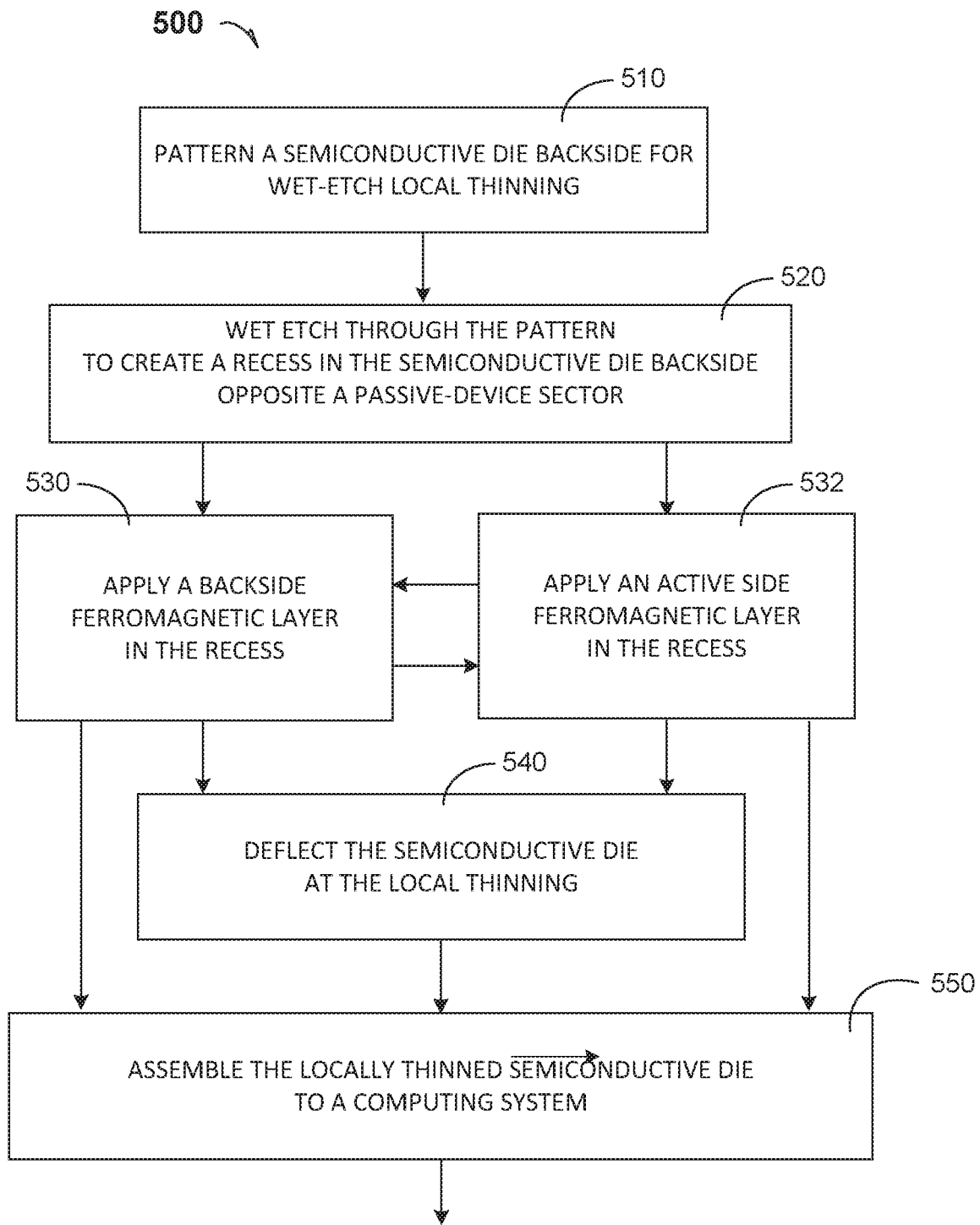
FIG. 5 is a process flow diagram that illustrates fabrication of a thinned-bridge assembly of an embedded-bridge substrate connector apparatus according to an embodiment.

FIG. 5 is a process flow diagram 500 that illustrates fabrication of a thinned-bridge assembly of an embedded-bridge substrate connector apparatus according to an embodiment.

At 510, the process includes patterning a die backside in preparation for wet-etch local thinning.

At 520, the process includes wet etching through the pattern to create a recess and local thinning in the semiconductive die. In a non-limiting example embodiment, the backside 112 of the semiconductive die 10 has been patterned and wet etched to open the recess 113 as depicted in FIG. 1C. In a non-limiting example embodiment, the backside 212 of the semiconductive die 20 has been patterned and wet etched to open the edge recess 213 as depicted in FIG. 2C. In a non-limiting example embodiment, the backside 312 of the semiconductive die 30 has been patterned and wet etched to open the recess 313 as depicted in FIG. 3A.

At 530, the process includes applying a backside ferromagnetic layer in the recess. In a non-limiting example embodiment, the backside ferromagnetic layer 122 has been deposited into the recess 113 as depicted in FIG. 1D. In a non-limiting example embodiment, the backside ferromagnetic layer 227 has been deposited into the recess 213 as depicted in FIG. 2D. In a non-limiting example embodiment, the backside ferromagnetic layer 322 has been deposited into the recess 313 as depicted in FIG. 3A.

At 532, the process includes applying an active surface ferromagnetic layer to the semiconductive die above the passive-device sector. In a non-limiting example embodiment, the active surface ferromagnetic layer 124 has been deposited above the coil-containing metallization layer in the passive-device sector 118 of the semiconductive die 10 as depicted in FIG. 1D. In a non-limiting example embodiment, the active surface ferromagnetic layer 224 has been deposited above the coil-containing metallization layer 220 in the passive-device sector 218 of the semiconductive die 20 as depicted in FIG. 2D. In a non-limiting example embodiment, the active surface ferromagnetic layer 324 has been deposited above the coil-containing metallization layer 320 in the passive-device sector 318 of the semiconductive die 30 as depicted in FIG. 3A.

Figure 6:
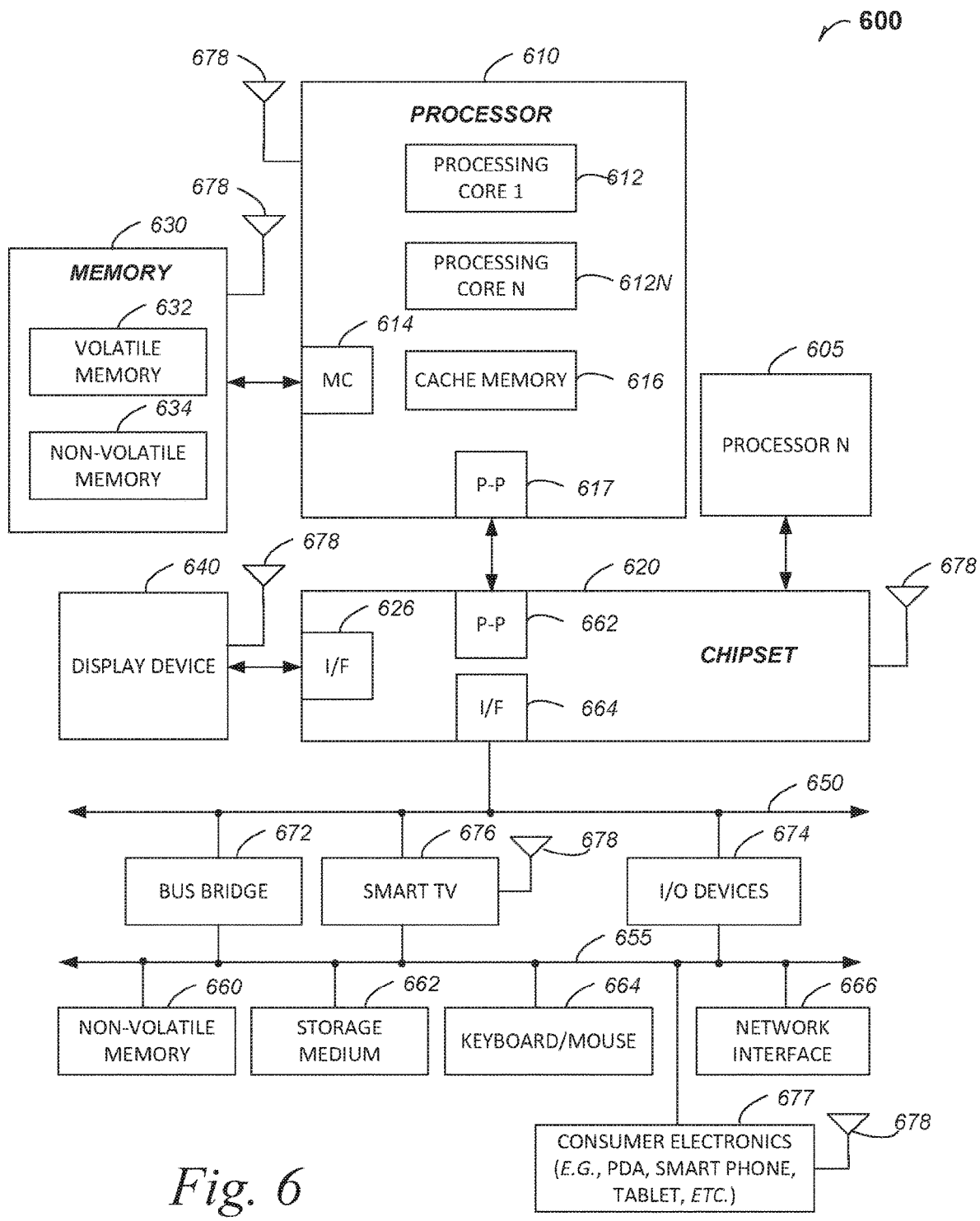
FIG. 6 is included to show an example of a higher level device application for the disclosed embodiments.

FIG. 6 is included to show an example of a higher level device application for the disclosed embodiments. The thinned bridge for magnetic coils embodiments may be found in several parts of a computing system. In an embodiment, a computing system 600 includes, but is not limited to, a desktop computer. In an embodiment, a system 600 includes, but is not limited to a laptop computer. In an embodiment, a system 600 includes, but is not limited to a netbook. In an embodiment, a system 600 includes, but is not limited to a tablet. In an embodiment, a system 600 includes, but is not limited to a notebook computer. In an embodiment, a system 600 includes, but is not limited to a personal digital assistant (PDA). In an embodiment, a system 600 includes, but is not limited to a server. In an embodiment, a system 600 includes, but is not limited to a workstation. In an embodiment, a system 600 includes, but is not limited to a cellular telephone. In an embodiment, a system 600 includes, but is not limited to a mobile computing device. In an embodiment, a system 600 includes, but is not limited to a smart phone. In an embodiment, a system 600 includes, but is not limited to an internet appliance. Other types of computing device may be configured with the microelectronic device that includes thinned bridge for magnetic coils embodiments.

In an embodiment, the processor 610 has one or more processing cores 612 and 612N, where 612N represents the Nth processor core inside processor 610 where N is a positive integer. In an embodiment, the electronic device system 600 using a thinned bridge for magnetic coils embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the thinned bridge for magnetic coils apparatus in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a thinned bridge for a magnetic coils embodiment as set forth in this disclosure. The chipset 620 enables the processor 610 to connect to other elements in the embedded-bridge substrate connector apparatus in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In and embodiment, the processor 610 and the chipset 620 are merged into a thinned bridge for magnetic coils apparatus in a system. Additionally, the chipset 620 connects to one or more buses 650 and 655 that interconnect various elements 674, 660, 662, 664, and 666. Buses 650 and 655 may be interconnected together via a bus bridge 672 such as at least one thinned bridge for magnetic coils embodiment. In an embodiment, the chipset 620 couples with a non-volatile memory 660, a mass storage device(s) 662, a keyboard/mouse 664, and a network interface 666 by way of at least one of the interface 624 and 674, the smart TV 676, and the consumer electronics 677, etc.

In and embodiment, the mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the thinned bridge for magnetic coils embodiment in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

Where useful, the computing system 600 may have an outer shell. Referring to FIG. 3A, when the die 30 is assembled to a mounting substrate 350 it is flip-chip bonded by mating the active surface 310 to the mounting substrate 350 such as by a ball-grid array. In an embodiment, the die 30 may be backside mounted onto mounting substrate and wire-bonded to the mounting substrate 350 (inverting the die 30 and omitting the bond pads on the mounting substrate). In an embodiment, the mounting substrate includes an outer shell 352 that is an electrically insulated structure that also provides physical protection for the thinned bridge for magnetic coils embodiment.

Figure 7:
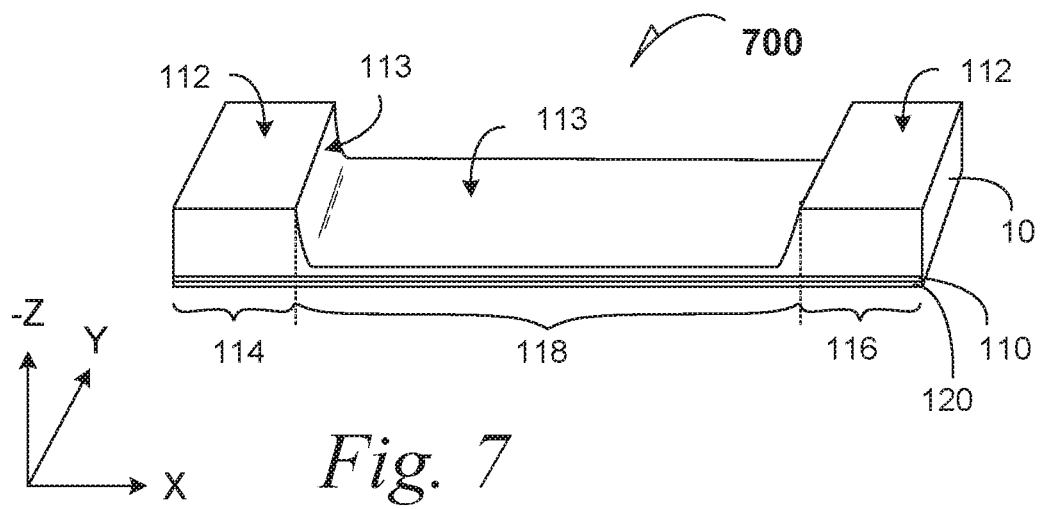
FIG. 7 is a perspective elevation of a semiconductive device apparatus that includes a thinned silicon-bridge region for a coil according to an embodiment.

FIG. 7 is a perspective elevation of a semiconductive device apparatus 700 that includes a thinned silicon-bridge region for a coil according to an embodiment. The semiconductive die 10 has been backside reduced to create a recess that extends in the Y-direction across the breadth of the die 10. With this structural configuration, the semiconductive die 10 can be deflected within the passive device region 118. The semiconductive sectors 114 and 116 do not necessarily represent the balance of the die.

Figure 8:
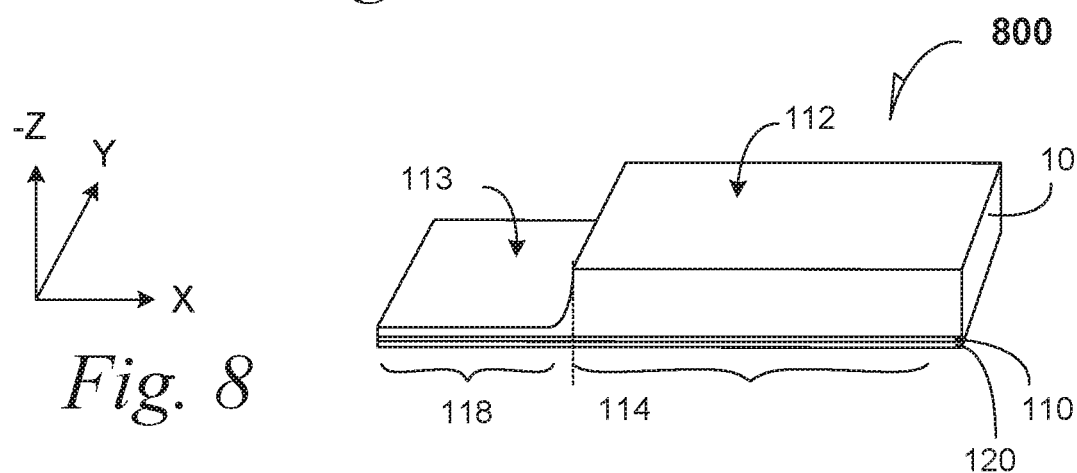
FIG. 8 is a perspective elevation of a semiconductive device apparatus that includes a thinned silicon exclave region for a coil according to an embodiment.

FIG. 8 is a perspective elevation of a semiconductive device apparatus 800 that includes a thinned silicon exclave region for a coil according to an embodiment. The semiconductive die 10 has been backside reduced along an entire edge to create an edge recess that extends in the Y-direction across the breadth of the die 10.

Figure 9:
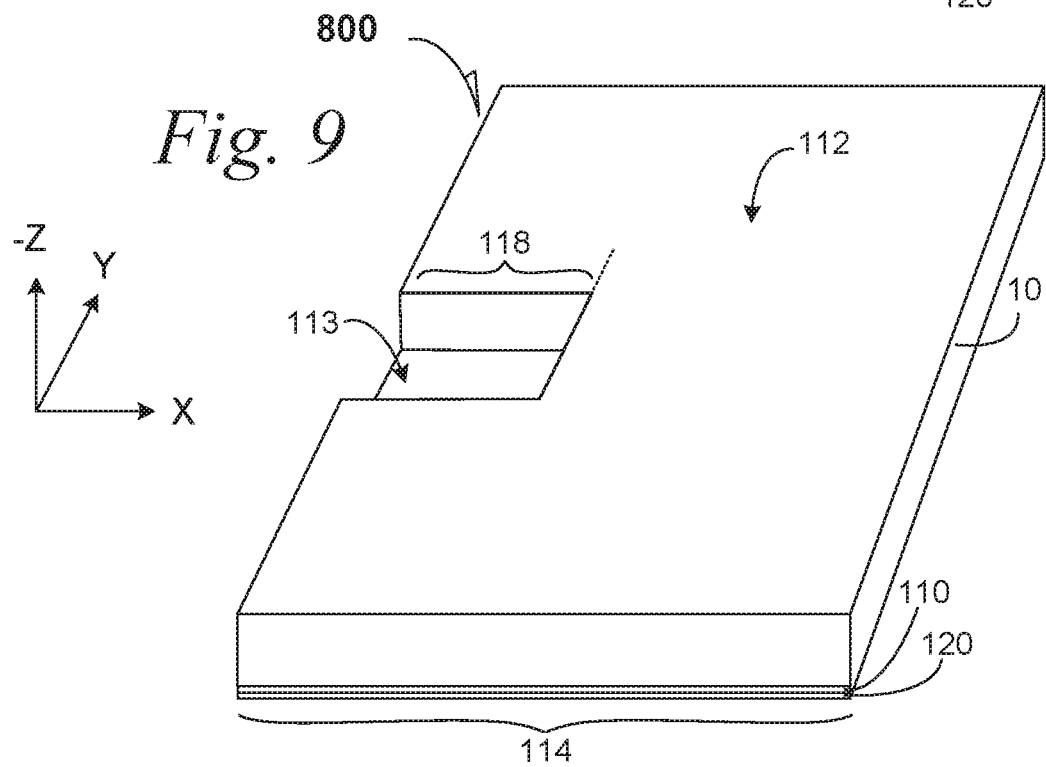
FIG. 9 is a perspective elevation of a semiconductive device apparatus that includes a thinned silicon exclave region for a coil according to an embodiment.

FIG. 9 is a perspective elevation of a semiconductive device apparatus 900 that includes a thinned silicon exclave region for a coil according to an embodiment. The semiconductive die 10 has been backside reduced in a limited section 118 at an edge to create an exclave edge recess 113 that extends into the die 10, but that has a Y-direction dimension that is less than the breadth of the die 10.

To illustrate the thinned bridge for magnetic coils embodiments and methods disclosed herein, a non-limiting list of examples is provided herein:

EXAMPLES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A semiconductive apparatus, comprising:
   a semiconductive die including an active surface, a backside surface and a recess in the backside surface;
   a metallization layer on the active surface, wherein the metallization includes an inductor coil positioned above the recess; and
   an active surface ferromagnetic layer disposed above the inductor coil.

2. The semiconductive apparatus of claim 1, further including a backside ferromagnetic layer disposed in the recess.

3. The semiconductive apparatus of claim 1, further including:
   an active surface ferromagnetic layer disposed above the inductor coil; and
   a backside ferromagnetic layer disposed in the recess.

4. The semiconductive apparatus of claim 1, wherein the thinned bridge is deflected out of planarity to a degree between 1° and about 180°.

5. The semiconductive apparatus of claim 1, wherein the die is locally thinned at an edge of the die.

6. The semiconductive apparatus of claim 1, wherein the die is locally thinned as an exclave of the die at an edge of the die.

7. The semiconductive apparatus of claim 1, wherein the die is locally thinned as an entire edge of the die.

8. The semiconductive apparatus of claim 1, wherein the die is locally thinned as an enclave of the die.

9. The semiconductive apparatus of claim 1, wherein the recess reaches bottom at a depth, wherein the semiconductive die has an overall height that is about four times taller than the recess bottom depth.

10. The semiconductive apparatus of claim 1, wherein the recess reaches bottom at a depth, wherein the recess bottom depth is about half the semiconductive die overall height.

11. The semiconductive apparatus of claim 1, wherein the recess reaches bottom at a depth, wherein the semiconductive die has an overall height that is more than double the recess bottom depth.

12. The semiconductive apparatus of claim 1, further including:
   an active surface ferromagnetic layer disposed above the inductor coil; and
   a backside ferromagnetic layer disposed in the recess, wherein the active surface ferromagnetic layer has a first ferromagnetivity and the backside ferromagnetic layer has a different ferromagnetivity.

13. The semiconductive apparatus of claim 1, further including:
   an active surface ferromagnetic layer disposed above the inductor coil; and
   a backside ferromagnetic layer disposed in the recess, wherein the ferromagnetivity of the backside ferromagnetic layer is the same as the ferromagnetivity of the active surface ferromagnetic layer.

14. The semiconductive apparatus of claim 1, further including:
   an active surface ferromagnetic layer disposed above the inductor coil; and
   a backside ferromagnetic layer disposed in the recess, wherein the ferromagnetivity of the backside ferromagnetic layer is quantitively different than the ferromagnetivity of the active surface ferromagnetic layer.

15. The semiconductive apparatus of claim 1, further including:
   an active surface ferromagnetic layer disposed above the inductor coil; and
   a backside ferromagnetic layer disposed in the recess, wherein the ferromagnetivity of the backside ferromagnetic layer is greater than the ferromagnetivity of the active surface ferromagnetic layer.

16. The semiconductive apparatus of claim 1, further including:
   an active surface ferromagnetic layer disposed above the inductor coil; and
   a backside ferromagnetic layer disposed in the recess, wherein the ferromagnetivity of the backside ferromagnetic layer is less than the ferromagnetivity of the active surface ferromagnetic layer.

17. A computing system, comprising:
   a semiconductive die that includes:

a locally thinned region, wherein the locally thinned region is formed in a recess at a backside surface of the die;
and active area of the die disposed opposite the backside surface;
a metallization covering the active area including an inductor coil disposed vertical to the recess;
an active surface ferromagnetic layer disposed above the inductor coil; and
a mounting substrate onto which the die is disposed.

18. The computing system of claim 17, wherein the mounting substrate includes an insulated outer shell.

\* \* \* \* \*